United States Patent [19]

Lauterbach et al.

[11] Patent Number: 5,029,748
[45] Date of Patent: Jul. 9, 1991

[54] SOLDER PREFORMS IN A CAST ARRAY

[75] Inventors: John H. Lauterbach, Hudson; Leon T. Ritchie, Clearwater, both of Fla.

[73] Assignee: AMP Incorporated, Harrisburg, Pa.

[21] Appl. No.: 323,642

[22] Filed: Mar. 15, 1989

Related U.S. Application Data

[63] Continuation-in-part of Ser. No. 72,209, Jul. 10, 1987, abandoned.

[51] Int. Cl.$^5$ .......................... B23K 1/00; B23K 3/00; B23K 35/02
[52] U.S. Cl. ................................ 228/180.1; 228/255; 228/56.3
[58] Field of Search .................... 228/180.1, 56.3, 246, 228/254, 253, 255

[56] References Cited

U.S. PATENT DOCUMENTS

| | | | |
|---|---|---|---|
| 2,838,593 | 6/1958 | Scesa et al. | 228/56.3 |
| 3,002,481 | 10/1961 | Hutters | 228/56.3 |
| 3,932,934 | 1/1976 | Lynch et al. | 228/255 |
| 4,050,621 | 9/1977 | Bouley | 228/180.1 |
| 4,090,768 | 5/1978 | Tregoning | 228/56.3 |
| 4,164,064 | 8/1979 | Reavill et al. | 228/253 |
| 4,216,350 | 8/1980 | Reid | 228/56.3 |
| 4,557,411 | 12/1985 | Farquharson et al. | 228/56.3 |
| 4,663,815 | 5/1987 | Hartman et al. | 228/56.3 |
| 4,767,344 | 8/1988 | Noschese | 228/180.1 |
| 4,884,335 | 12/1989 | McCoy et al. | 228/180.1 |
| 4,896,816 | 1/1990 | Lascar et al. | 228/56.3 |

OTHER PUBLICATIONS

Alloys Unlimited Inc., "A Guide to Preform Soldering", Tin Research Institute, Cleveland, Ohio, 1959.

Primary Examiner—Sam Heinrich
Attorney, Agent, or Firm—Robert W. Pitts

[57] ABSTRACT

Cast solder preforms, rings or donuts suitable for use in a reflow solder process to interconnect through-hole pins in an electrical connector to plated through holes in a printed circuit board are disclosed. A plurality of solder donuts are cast into an array so that the plurality of donuts are initially formed as a single unit. The donuts can be either cast onto pins in a connector or cast onto a separate carrier for subsequent insertion onto the pins in a connector.

9 Claims, 12 Drawing Sheets

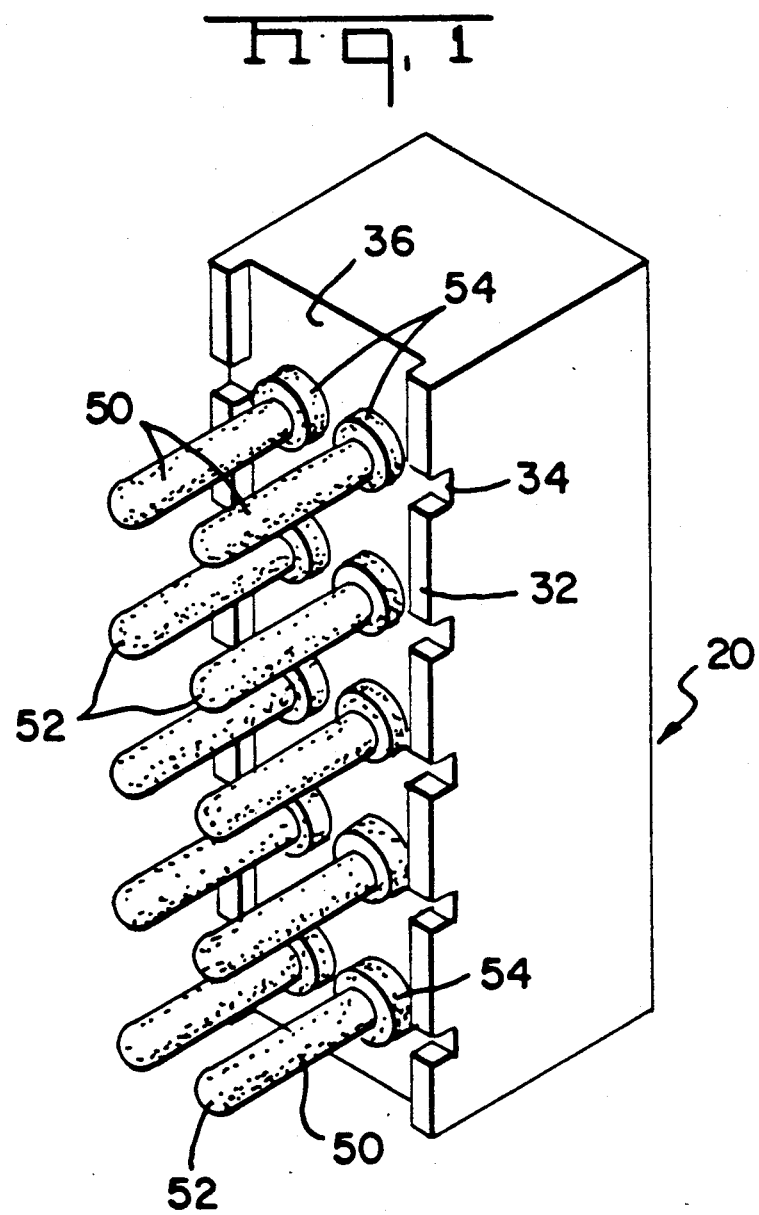

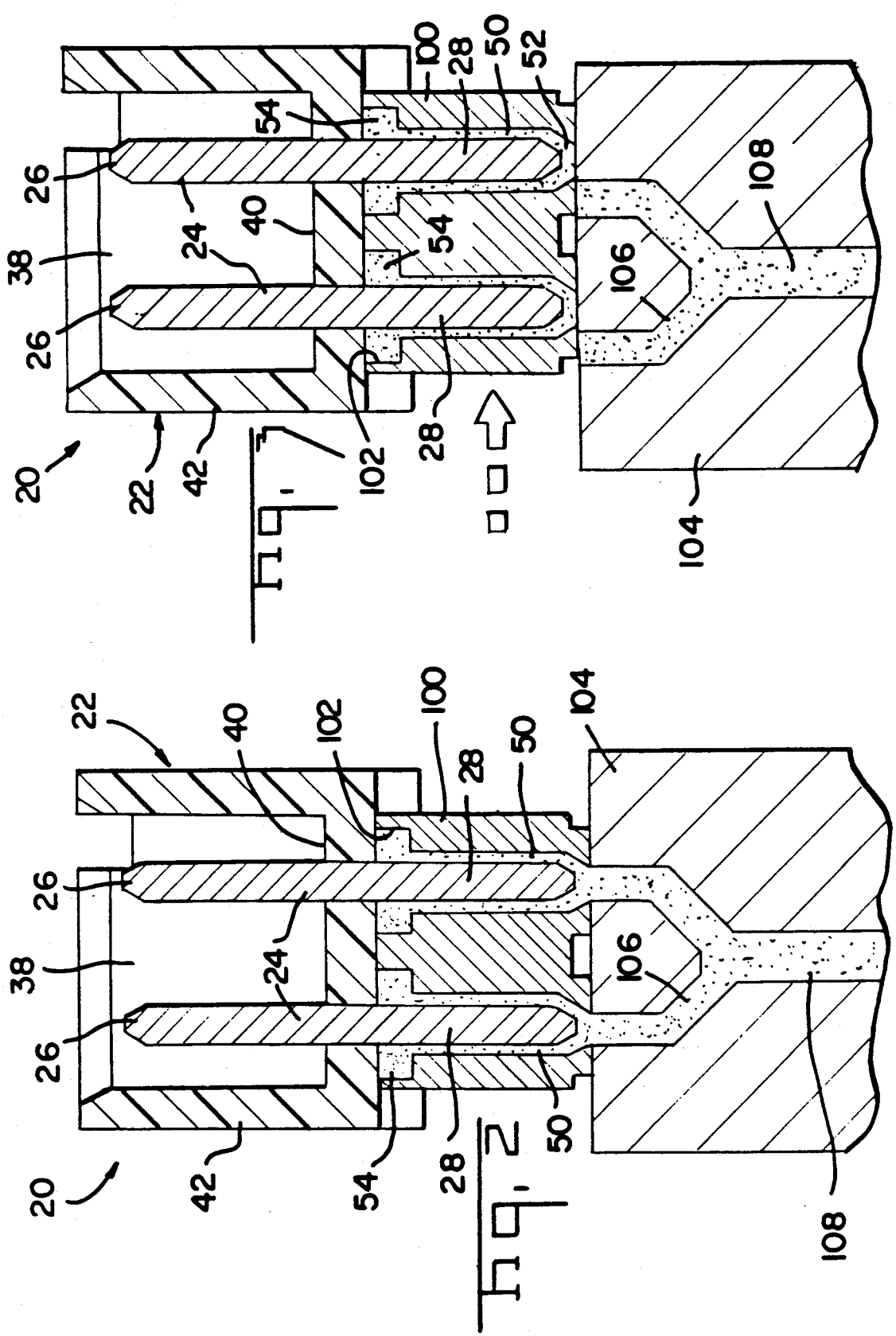

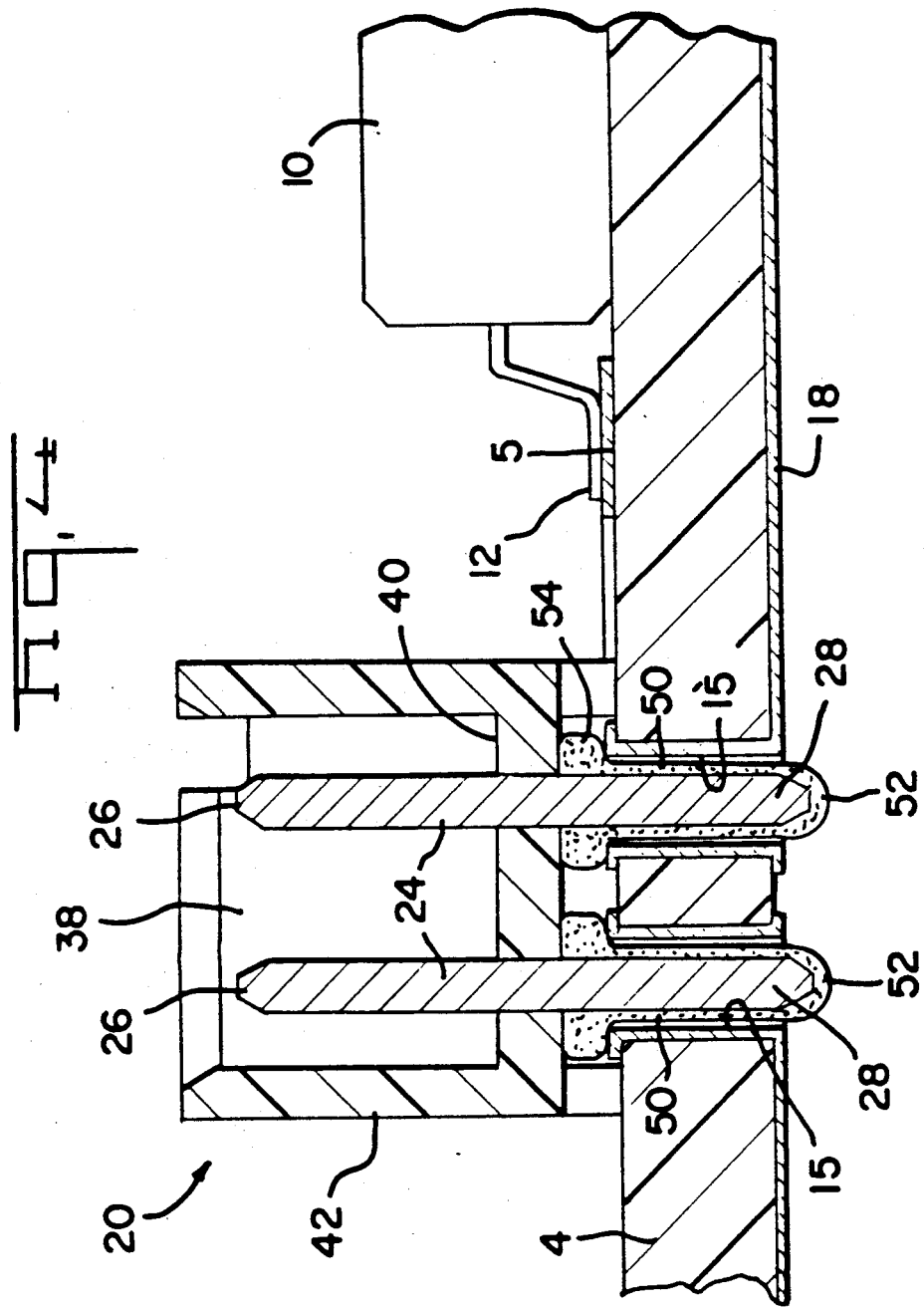

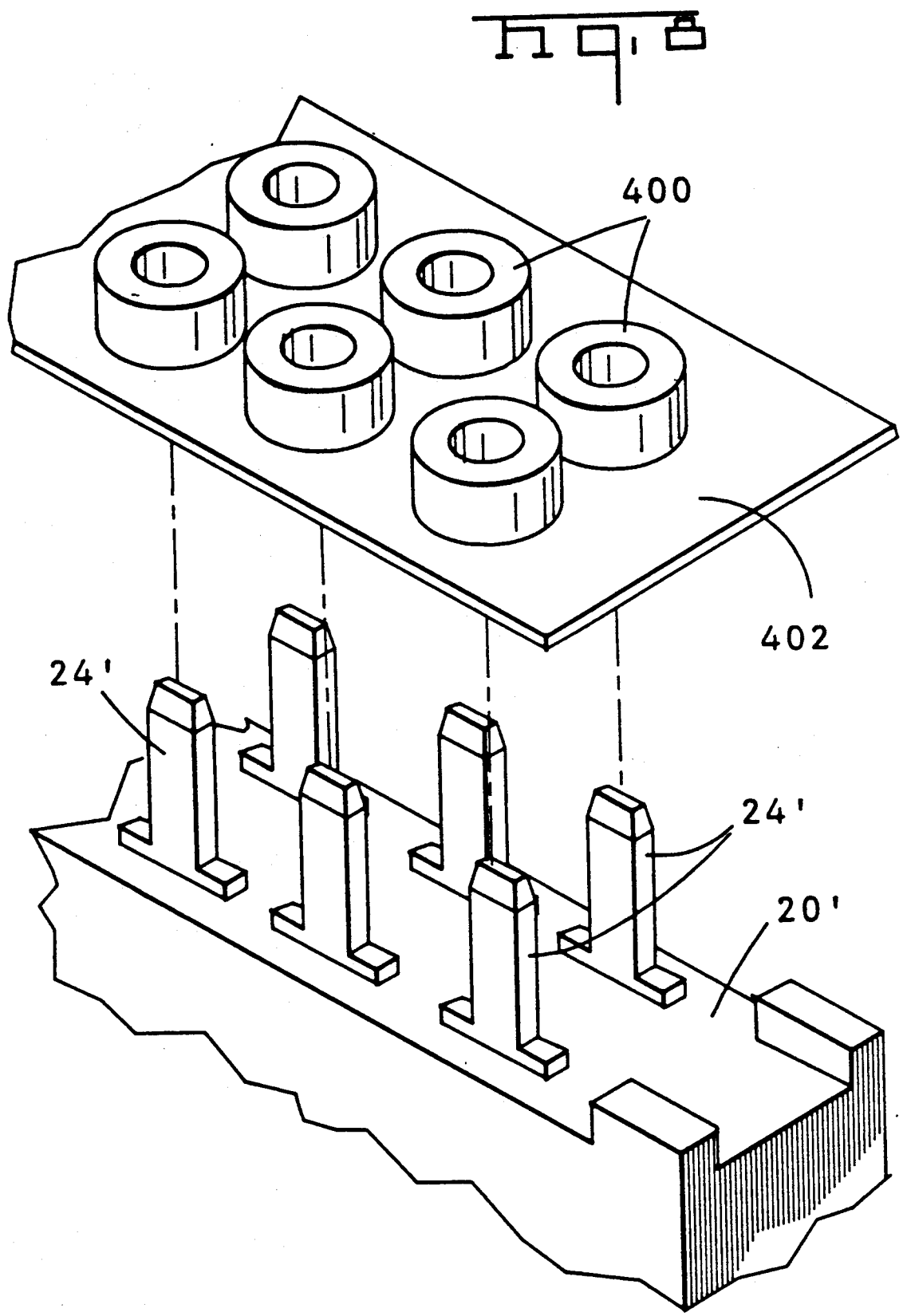

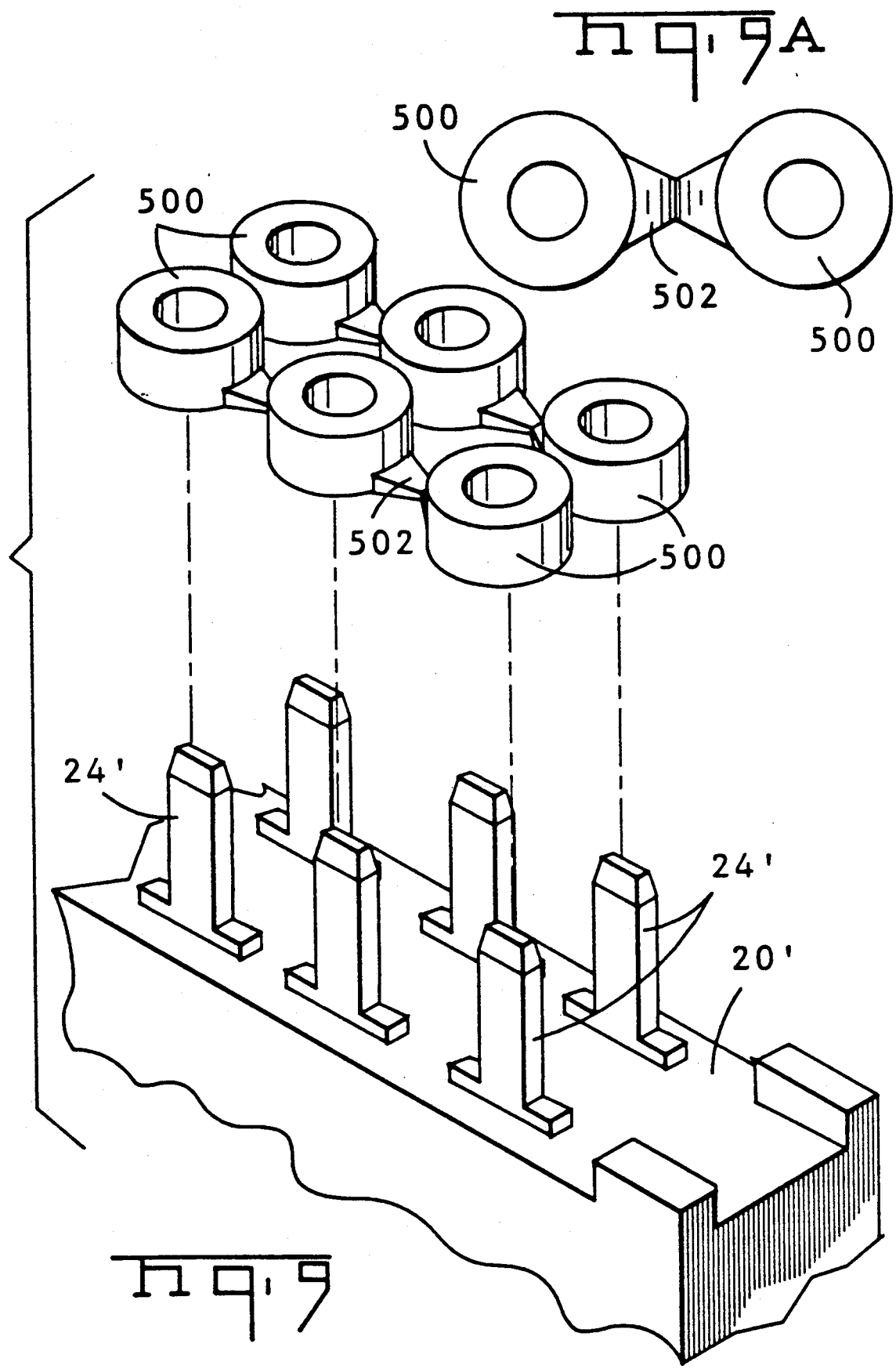

SOLDER PREFORMS IN A CAST ARRAY

CROSS REFERENCE TO PENDING APPLICATIONS

This is a continuation in part of application Ser. No. 072209 filed July 10, 1987, now abandoned.

BACKGROUND OF THE INVENTION

1. Field of the Invention

This invention relates to the use of solder preforms for attaching leaded components to plated through holes in a printed circuit board and more specifically relates to use of solder preforms which can be used to attach leaded components into through holes in a printed circuit board in a manner which is compatible with conventional surface mount soldering processes.

2. Description of the Prior Art

Conventional techniques for applying leaded components to a printed circuit board include the use of plated through holes and the use of surface mount components. Surface mount components can be soldered to a printed circuit board by conventional reflow processes in which solder or a solder loaded flux is deposited onto a printed circuit board component site. Surface mount components can then be placed into a wet solder paste or an adhesive can be used to hold the component in place. The solder paste is then reflowed using vapor phase, infrared radiation, or convective heating.

Through hole leaded components are typically soldered to a printed circuit board by using a wave soldering process. Conventional wave soldering processes and reflow soldering processes are not compatible, at least in the sense that processes can be simply combined or carried out simultaneously. Various approaches have been suggested in which both leaded and surface mount components can be applied to the same printed circuit board using a reflow process. For example, as suggested in U.S. Pat. No. 4,761,881, a solder paste can be predeposited not only on surface mount pads but also within plated through holes in a printed circuit board. Leads on components can then be inserted into the plated through holes and through the solder paste. This process, however, requires a cure step in which the solder paste on the assembled printed circuit board is baked to remove volatiles from the solder paste prior to the reflow process. Such curing steps can take approximately 45 minutes.

It has also been suggested that a solder paste can be placed within reservoirs formed within the body of a leaded electrical device such as an electrical connector. U.S. Pat. No. 4,641,426 discloses a connector having recesses surrounding leaded pins on the lower surface of a printed circuit board into which a solder paste can be deposited and then cured prior to shipping. These recesses would be defined between stand-offs which comprise integral portions of the electrical connector body.

U.S. Pat. No. 4,767,344 discloses a process in which a solder paste is molded around terminal pins to form premolded beads. The individual solder paste elements are heated within the mold to remove carrier materials with initially disc shaped solder beads ultimately forming teardrop shaped beads.

Each of these processes requires a relatively lengthy curing process. An alternative approach for depositing solder in position to permit leaded components to be soldered to a printed circuit board in a through-hole mounted process is to employ discreet solder preforms, typically in the form of rings or doughnuts. These individual preforms can be placed in surrounding relationship to individual leads between the component and holes in a printed circuit board. For instance, U.S. Pat. No. 4,216,350 discloses a process in which individual solder rings are pressed into apertures in a non-fusible web, either manually or by a automated process prior to positioning the web containing the discreet solder ring in surrounding relationship to pins on a leaded component. This process and other processes which employ discrete solder rings either requires a laborious hand assembly operation in which the rings are individually handled, or an expensive automated process for loading the solder rings or preforms in place. On such apparatus for placing apertured soldered preforms onto pins of an electrical connector is disclosed in U.K. Patent 2,080,262.

Although each of these techniques has certain advantages, each involves a step which is expensive in terms of the time required or in terms of the requirement that expensive automated equipment is necessary. The instant invention in which solder preforms, rings or doughnuts are cast, from pure tin lead solder into an ordered array, eliminates the necessity for lengthy curing of solder paste and also permits a plurality of solder preforms to be handled as a single unit in a single array.

SUMMARY OF THE INVENTION

This invention relates to a method and apparatus for soldering through-hole electrical contact pins in through-holes in a printed circuit board by reflowing solder predisposed on the pins so that the predisposed solder flows into each plated through-hole. A plurality of solder free preforms are cast in an array corresponding to the positions of the holes in the printed circuit board. The solder preforms in the array can thus be predisposed on the pins prior to soldering. By employing cast solder preforms in this manner, standard through-hole electrical connectors can be adapted for use on hybrid printed circuit boards containing surface mount pads as well as plated through-hole. The through-hole connectors can be soldered to the plated through-hole by using conventional surface mount reflow soldering operations such as infrared radiation heating and vapor phase reflow.

This apparatus and method can be employed in a number of different embodiments. The solder can be cast in an array directly onto pins in a through-hole printed circuit board connector. A plurality of separate solder preforms can be simultaneously cast onto a carrier such as an insulative film. A plurality of discreet solder free preforms can be cast into an array in which adjacent preforms are maintained in position by solder link segments having a thickness much less then the discreet solder preforms. The solder preforms can also be provided with a web which permits the solder preforms to be temporarily held on through-hole pins by a friction fit.

BRIEF DESCRIPTION OF THE DRAWINGS

FIG. 1 is a prospective view of an electrical connector with plural solder preform predispossed on through-hole pins in accordance with one embodiment.

FIG. 2 is a view of a casting process in which solder is cast directly on the pins in a standard electrical connector.

FIG. 3 is a view showing separation of solder runners in the casting process of FIG. 2.

FIG. 4 is a view showing the positioning of an electrical connector with solder cast around through-hole pins on a printed circuit board containing both plated through-holes and surface mount pads.

FIG. 8 depicts an array of cast solder preforms located on a carrier strip for positioning on a connector.

FIG. 9 and 9A show an array of cast solder preforms in which adjacent preforms are joined by a thin link section.

DETAILED DESCRIPTION OF THE PREFERRED EMBODIMENTS

Figure 5:
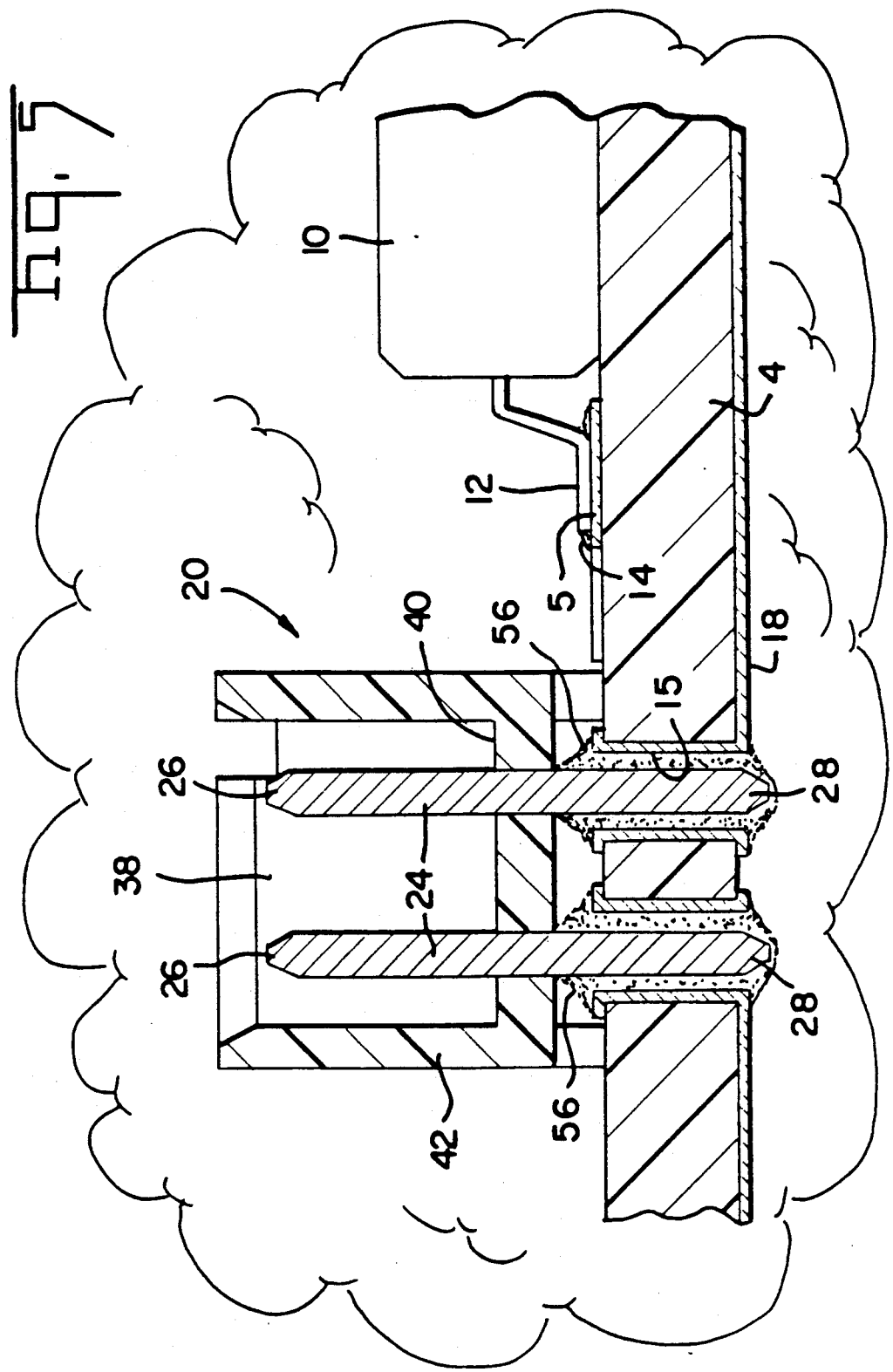
FIG. 5 depicts a vapor phase reflow soldering process in which the through-hole connector having predisposed solder preforms is soldered to plated through-holes.

Connector 20 comprises a through-hole shrouded header having a plurality of separate terminals or pins 24 which extend into holes 15 extending between opposite surfaces of a printed circuit board 4. The shrouded header 20 depicted herein is representative of any number of generally conventional electrical connectors which rely upon through-hole leads to establish an interconnection with the printed circuit board. Connector 20 has an insulative housing 22. Unlike some conventional through-hold electrical connectors, the insulative housing 22 must be fabricated of a material which is capable of withstanding the heat of a conventional surface mount process. A number of conventional materials suitable for use as an insulative housing of a surface mount connector are available and these conventional materials can be employed to form the insulative housing 22 of this through-hole connector for hybrid use.

The terminals 24 employed in the shrouded header 20 comprise solid pins having a generally rectangular cross-section. The upper portion of the terminals 20 extends upwardly from the lower surface 36 of the housing 22 in a position to mate with a complementary connector (not shown). The upper portion 26 of the terminals can be selectively plated in a conventional manner to ensure that a satisfactory interconnection can be established with the terminals of the mating connector. The lower portion 28 of the terminals extends below the lower surface 36 of the housing and comprises a through-hole lead extending into holes 15. Pins 24 also extend through terminal receiving passages 30 in the housing floor 40. In this first embodiment of this invention, the terminal receiving passages 30 have a generally rectangular cross-section which closely conforms to the rectangular cross-section of the terminal pins 24. Terminal pins 24 can thus be inserted into terminal receiving passages 30 to form a close frictional fit or an interference fit to retain the terminals pins 24 in the floor 40 of the insulative housing 22. floor 40 with upstanding housing endwalls 38 and upstanding housing sidewalls 42 defining a mating cavity for receiving a mating connector. The upper portion 26 of each terminal 24 extends into this cavity formed by the upstanding endwalls and sidewalls. The housing floor 40 has a lower surface 36 which, in the preferred embodiment of this invention, is spaced from the upper surface of the printed circuit board 4. A plurality of standoff projections or ribs 32 located along the opposite edges of the housing floor 40 extend below the lower surface 36 and serve to position the lower surface 36 above the upper surface of the printed circuit board 4. These positioning standoff projections thus provide clearance permitting a suitable solder fillet to form at the entry of the individual terminals 24 into the holes 15. A plurality of channels 34 are defined between adjacent ribs 32. These channels 34 provide a means for flushing solder flux and other contaminates from beneath the housing after the reflow process. As seen more clearly in FIG. 2, the channels 34 are in alignment with the through-hole lead portions 28 of terminals 24. The standoff projections 32 do not extend completely across the lower surface 36 of the housing, but are rather located on the periphery of a flat center portion 46 of lower surface 36. When the through-hole connector 20 is soldered in holes 15 during a surface mount soldering process, a continuous solder joint is formed between the leads 28 and the holes 15. Solder fillets can also be formed along the top of the printed circuit board and along the bottom of the printed circuit board at the free ends of the terminals.

FIGS. 2, 3 and 4 depict the manner in which solder can be cast around the through-hole lead contact portions 28 of a plurality of terminals 24 positioned in two side-by-side rows. A casting mold 100 having a plurality of cylindrical mold cavities 102 into which the through-hole lead contact portion 28 can be inserted. The upper face of the casting mold 100 can be positioned flush with the central flat section 46 of the lower face 36 of the insulative housing 22. Thus, the flat surface 46 closes off the individual mold cavities. As shown in FIG. 4, molten solder under pressure can be forced through a sprue 108 into runners 106 communicating with the mold cavities 102 in the casting mold 100. Since the casting mold 100 would not be heated, the solder would solidify and would completely encircle the through-hole contact portions 28 of the terminals 24 to form a plurality of cast solder preforms 50 in an array. Lateral movement of the casting mold 100 relative to the heated casting block 104, as shown in FIG. 3, will sever the solder leaving each terminal with a solder layer covering the entire portion of the contact below the lower surface 36 of each terminal 24. Since the flat surface 46 closes off the individual mold cavities 102, the solder will also be flush with the lower surface 36 of the housing 22. The cast solder preforms 50 are melted during a conventional reflow process as depicted in FIG. 5.

Figure 6:
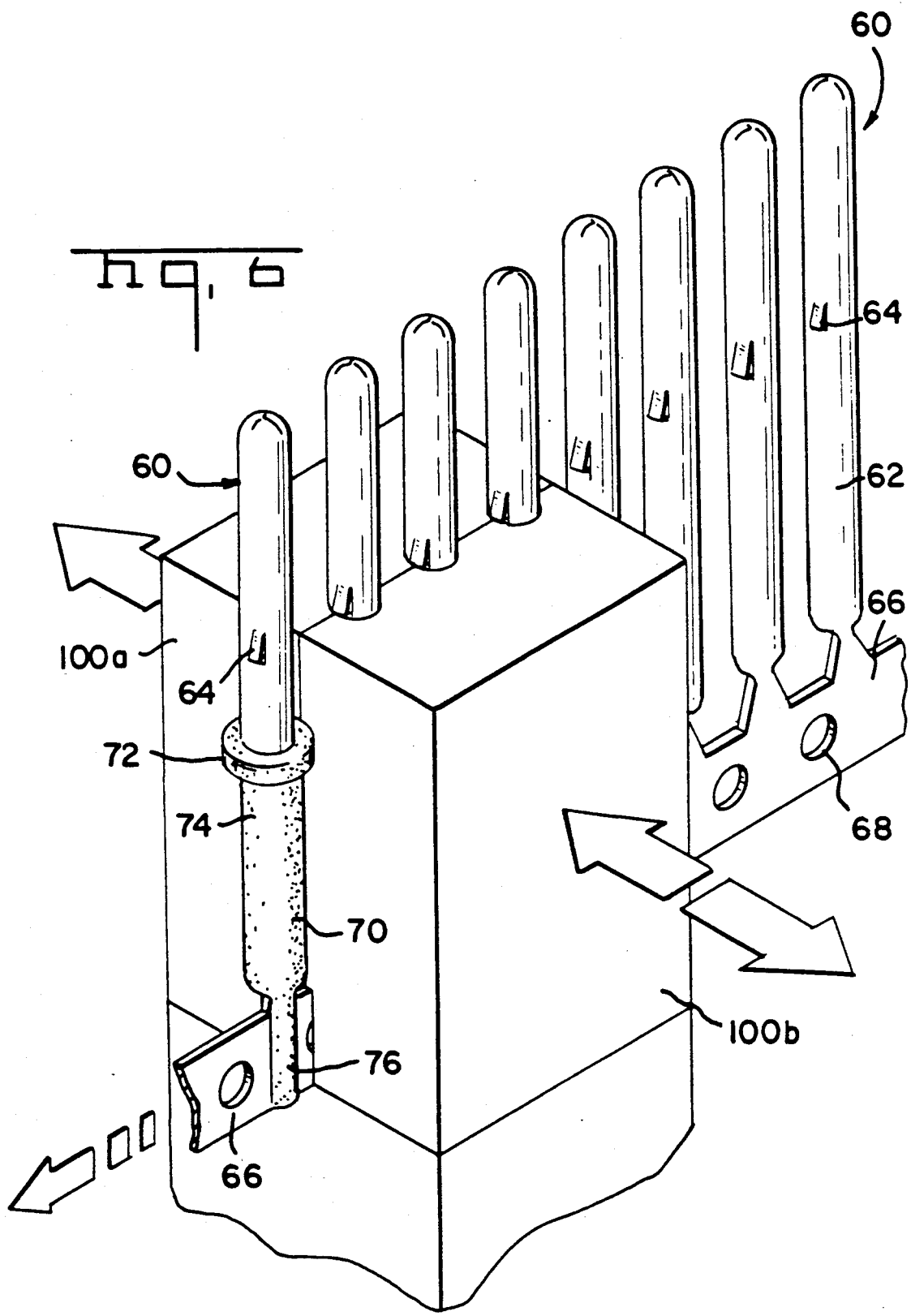
FIG. 6 is another embodiment of a process in which solder is cast directly onto pins located on a carrier strip prior to the insertion of the pins onto a connector.

In the alternate embodiment of FIG. 6, the solder preforms 70 are cast around stamped and formed terminals 60 before insertion of the terminal into insulative housing 22. Here the casting mold consists of two laterally shiftable blocks 200a and 200b, which close around both the stamped and formed terminals and the carrier strip 68. Solder flows upwardly around the carrier strip and into the mold cavity 102 to form a layer of solder having the same characteristics as that depicted in FIG.

3. Note, however, that a portion of the carrier strip is covered by a runner of solder 76. Since the stamped and formed terminal 60 can have resilient latches 64 stamped outwardly from a barrel 62, these terminals can be inserted upwardly through the housing floor 40.

In the first two embodiments, solder is injected into the cavity adjacent the free ends of the individual terminals. Thus, the solder flows axially along the through-hole lead portions 28 to form the layer of solder 70 on terminals 24 and 60. Axial flow of the solder brings the solder into flush engagement with lower surface of the connector housing. Individual solder preforms are simultaneously, individually cast in an array against an exterior housing surface. For each embodiment, the solder covers substantially the entire portion of the terminal below the lower surface of the insulative housing.

Figure 7:
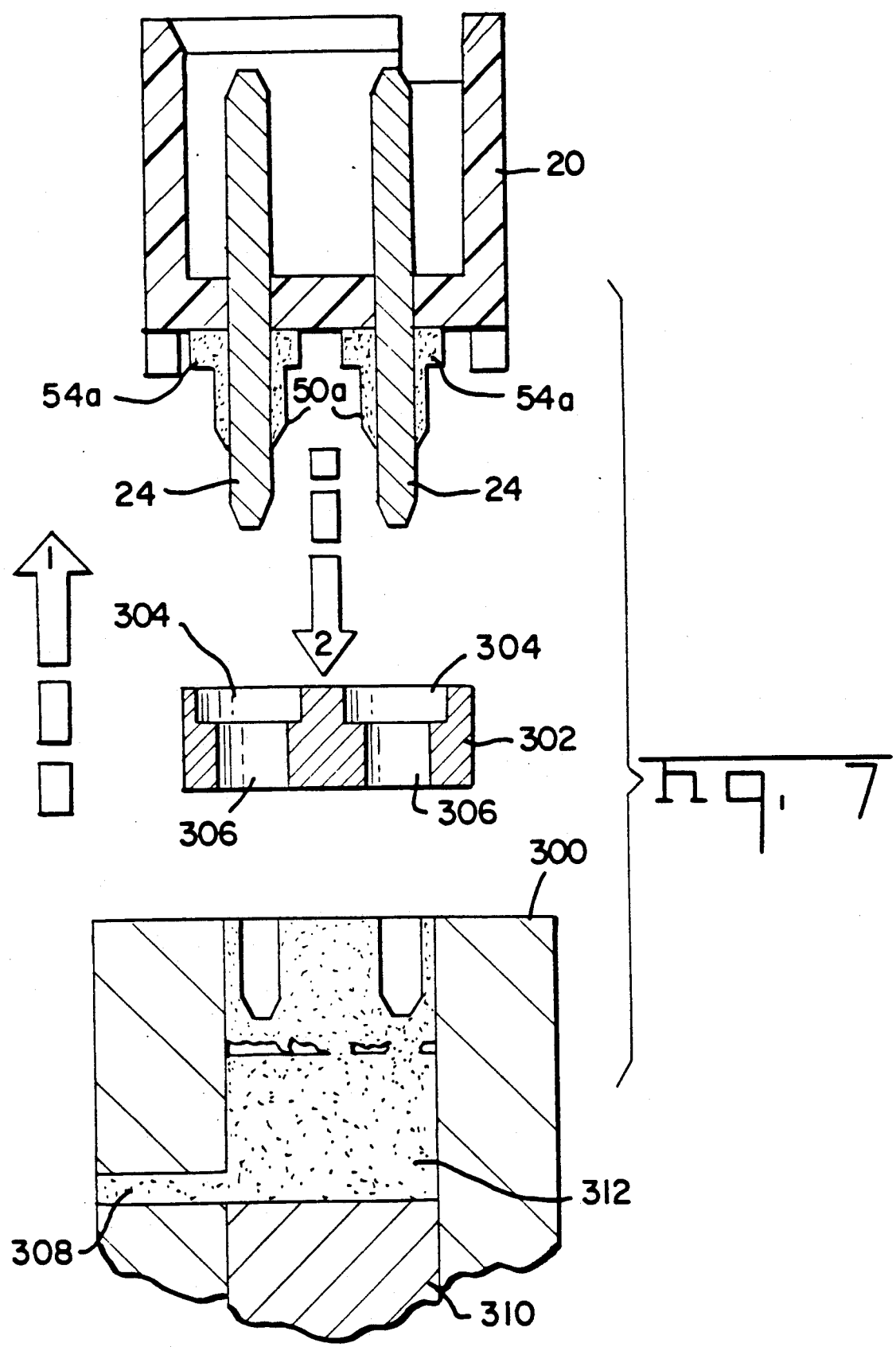
FIG. 7 depicts a soldering process in which solder is cast directly on the pins in the connector where the solder does not cover the entire length of the pins.

The embodiment of FIG. 7 depicts a casting method which is similar to the casting method of FIGS. 2-4 which offers some distinct advantages. This embodiment employs a separate die plate 302 defining a plurality of cavities receiving individual pins 24 in the connector 20. Each cavity has a relatively large doughnut shaped upper portion 304 which can be positioned adjacent the lower surface of the connector 20 and a lower portion 306 having a smaller inner diameter. The casting apparatus, such as die casting apparatus 300, employs a relatively large reciprocating plunger 310 which is shaped to generally correspond to the outline of the array of pins 24 in the connector 20, or in other words to correspond generally to the lower surface of the connector 20. Use of a plunger 310 having a shape corresponding to the array of pins 24 ensures an even distribution of molten solder to properly fill the cavities in the die plate 302. The die plate is positioned around the pins 24 in connector 20 before the pins 24 are inserted into an opening in the upper portion of the die casting apparatus 300. The die plate 302 conforms to the lower surface of the connector 20 so that discrete annular cavities are formed around each pin 24.

The connector and die plate subassembly can be initially positioned on the upper face of the casting apparatus 300 with the lower ends of pins 24 extending into an opening above the reservoir of solder 312. Upward movement of plunger 310 forces solder into the plurality of discrete cavities surrounding individual pins 24. After the cavities have been filled, the connector and die plate subassembly can then be removed from the casting apparatus 300. One unexpected advantage of this method is that while the solder in the reservoir 312 will at least partially solidify prior to removal of the connector and die plate subassembly. It has been found that the solder will not adhere to the lower portions of the pins 24. In at least some applications, it is desirable to have the lower ends of the pins 24 free from solder since the pins can be more easily insertable into the holes in a printed circuit board. After the connector and die plate subassembly have been removed from the casting apparatus, additional solder 314 enters the reservoir through an opening 308 after the plunger has been lowered to its initial position. The solidified solder 312 remaining in the reservoir will remelt during the next cycle. In the final step in this operation the die plate 302 is removed from the connector 20. Individual annular castings are formed around each pin 24. An upper section 54a, formed by the cavity portion 304, has a larger outer diameter than a lower portion 50a formed in the cavity section 306. Note that the lower portion of the solder casting 50a is suitable for insertion into a hole in a printed circuit board to ensure that the solder will adequately fill each hole in the printed circuit board. The cycle time for this casting operation can be on the order of 3-5 seconds.

Figure 8A:
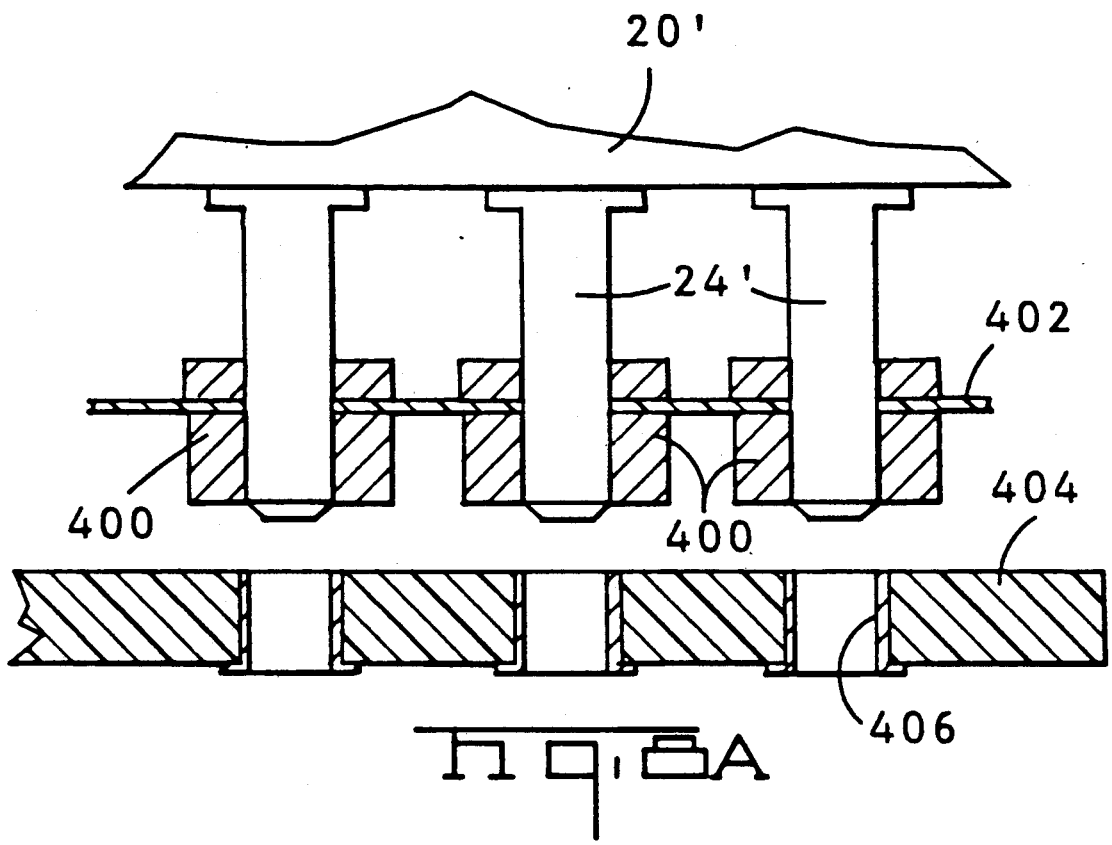
FIGS. 8A and 8B depict the manner in which multiple preforms on the carrier can be precisely positioned when the connector is mated to the printed circuit board.
Figure 8B:
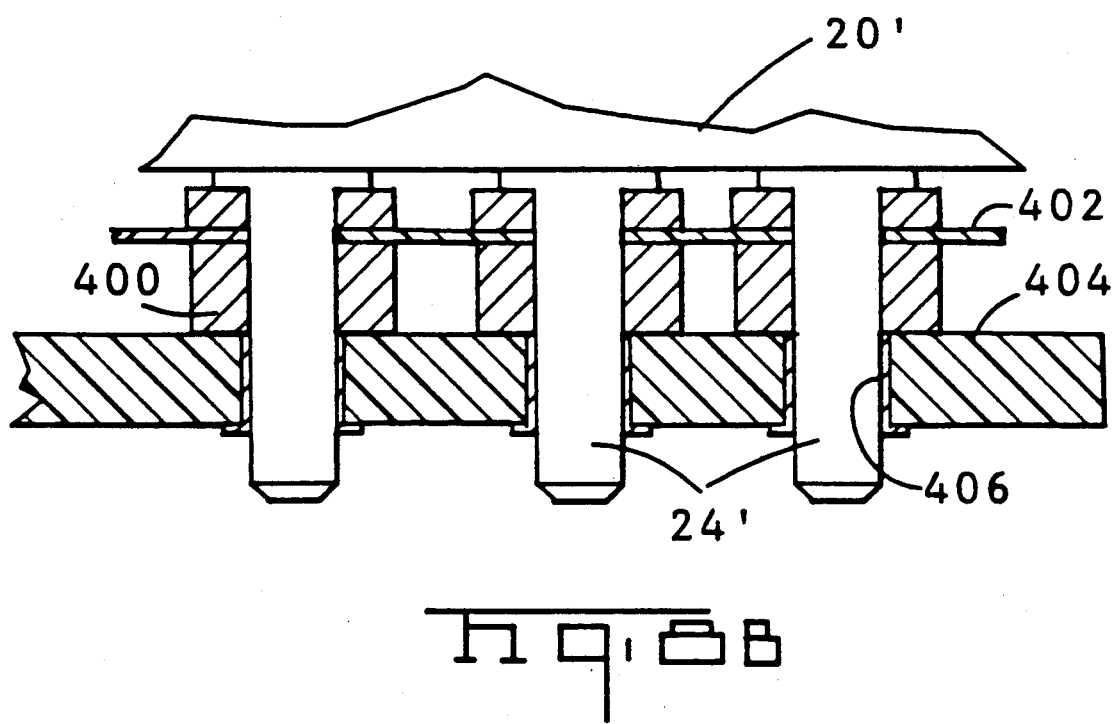

FIG. 8 depicts an alternate embodiment of this invention in which individual solder preforms or rings 400 are simultaneously cast in array on a flexible carrier film 402. This carrier film 402 can comprise an insulative material such as mylar, or it can comprise paper. The carrier strip would have a plurality of holes arranged to correspond to the positions of pins 24' in a conventional electrical connector 20'. Solder would be cast onto the carrier strip by positioning the carrier strip in the mold. Solder would then be cast on both side of the strip and through the strip. By casting solder preforms in this array, the solder preform array can be positioned on the pins 24' on a connector 20'. Because of the large number of pins, the solder array located on the flexible carrier 402 would not tend to fall off of the pins even if there is no interference fit between the soldered doughnuts or preforms and the individual pins. The solder doughnuts could however slide easily on the pins and could be pulled off the pins despite the fact they would not tend to inadvertently fall from the pins. As shown in FIGS. 8A and 8B, the solder preforms can be finally positioned when the connector 20 is mounted on a printed circuit board 404 having through holes 406.

FIGS. 9 and 9A show another embodiment in which individual solder preforms 500 are cast into an array. Integral solder links 502 join adjacent solder rings 500 to form an array similar to the array depicted in FIG. 8. The integral strips 502 are relatively thin and narrow and during the solder reflow process surface tension effects would cause these links 502 to break and the solder would flow toward the solder rings leaving the solder rings 500 separate.

Figure 10:
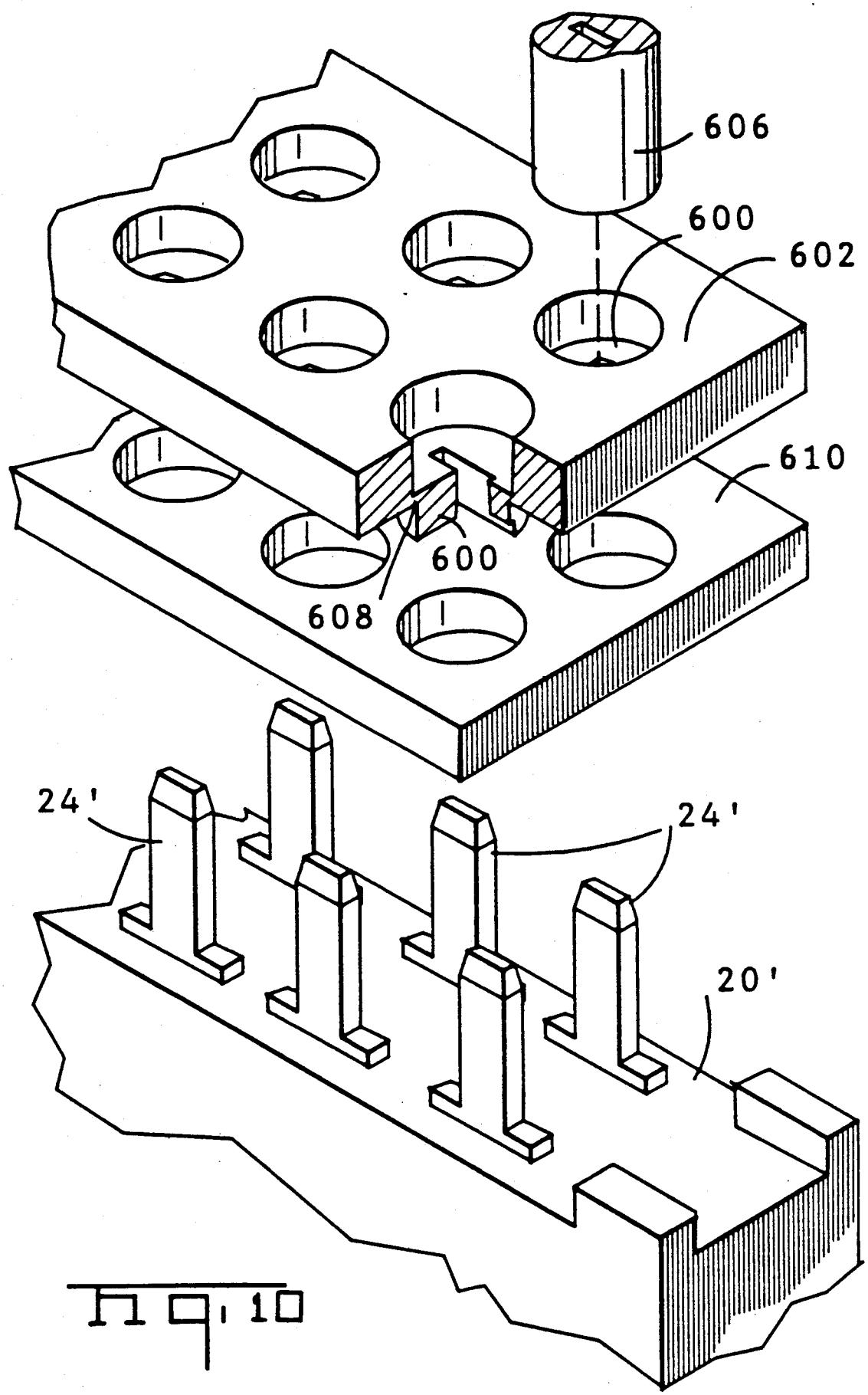
FIGS. 10 and 10A show an array of cast solder preforms in which individual solder preforms initially protrude from a larger cast solder block.
Figure 10A:
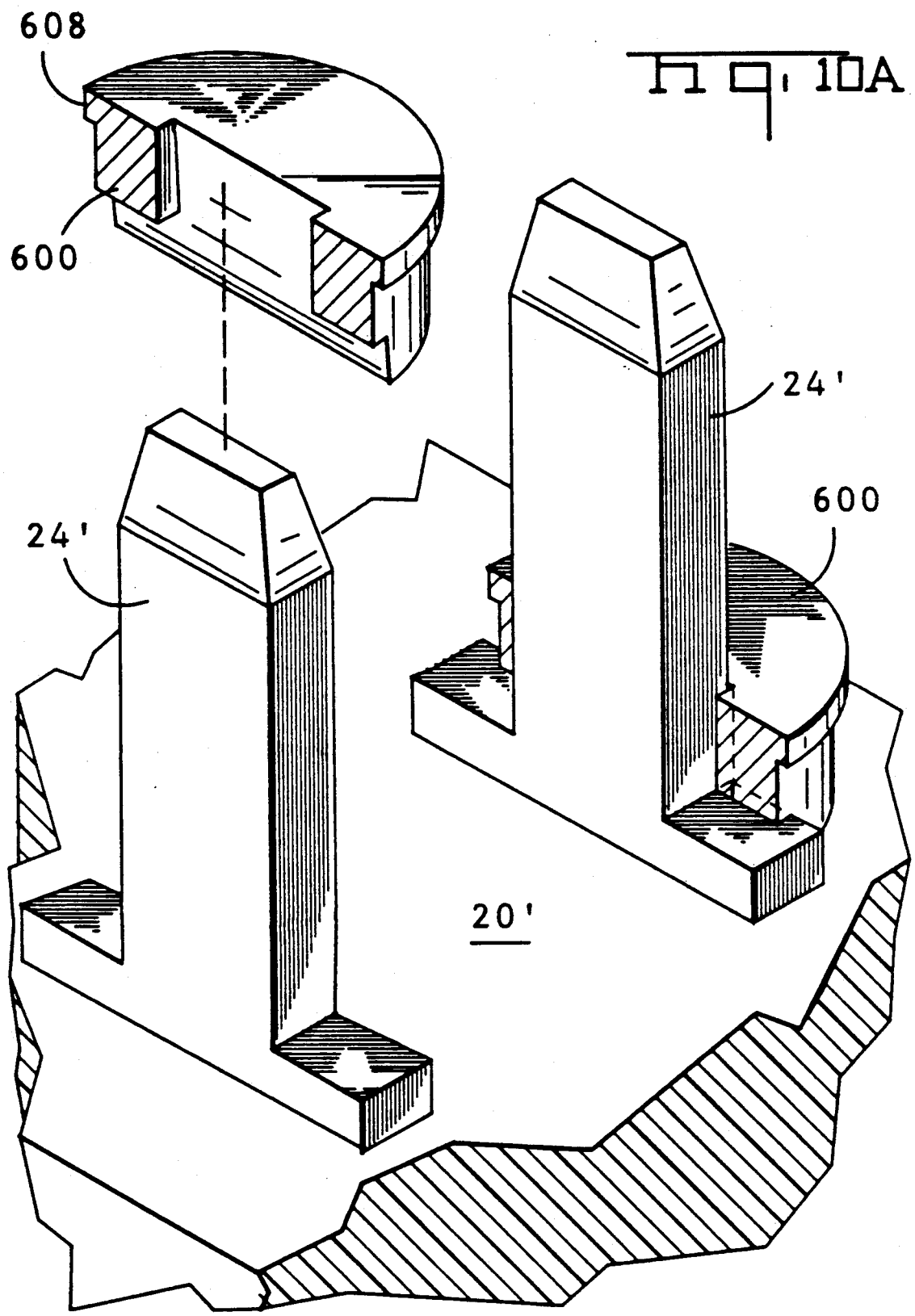

FIGS. 10 and 10A show another embodiment in which a solder block is formed with preforms 600 protruding below an upper block of solder 602. Solder preforms 600 can be dimensioned with a opening 604 adapted to form an interference fit with individual pins. The individual solder preforms cast in an array on block 602 are each joined to the block 602 by relatively thin interconnecting segment 608. The solder preforms 600 in an array can be gang loaded onto pins in an electrical connector by using a simple punch and die 606 and 610 which will shear the interconnecting segment 608 of each solder doughnut 600 from the block 602. By using this approach, individual solder preforms 600 would be disposed around discrete pins in the electrical connector.

Figure 11A:
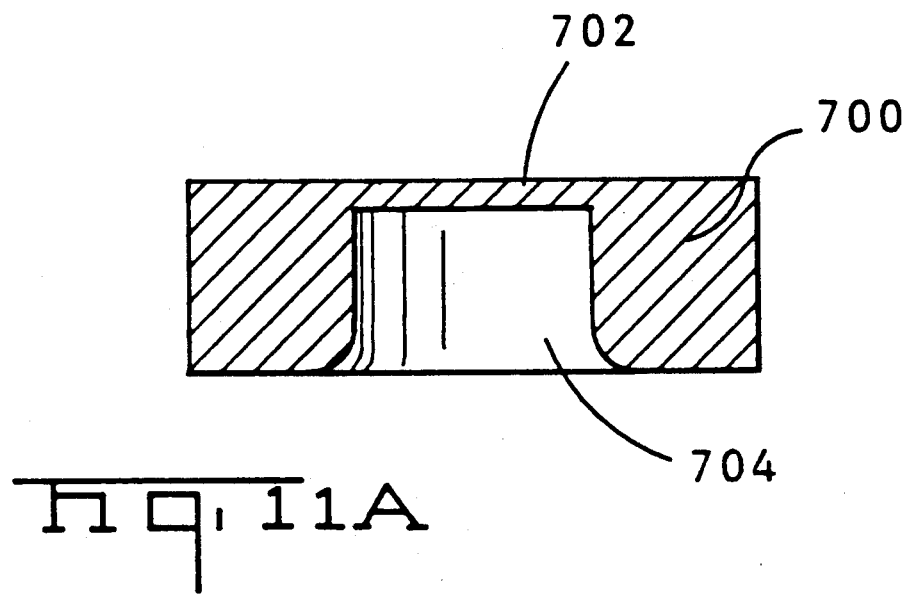
FIGS. 11A and 11B show a cast solder preform having a membrane for frictional securing solder preforms onto connector pins prior to solder reflow.
Figure 11B:
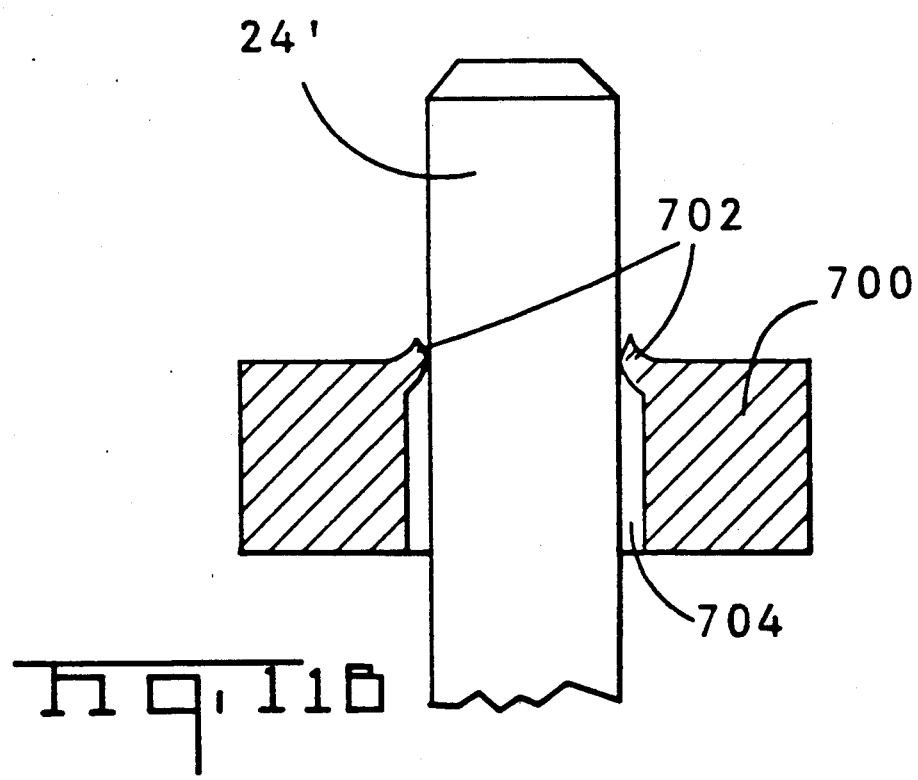

FIGS. 11A and 11B show solder preforms or doughnut 700 having a thin membrane 702 spanning the opening 704 in each solder doughnut. This thin membrane can be punctured when the solder preform is inserted onto a pin. Thus, the solder preform 700 can be loaded onto pins which do not conform precisely to the inner bore of the opening 704. This locking membrane 702 can be employed with any of the separately cast embodiments of this invention.

In this invention the solder preforms and solder preform arrays are cast from pure tin lead solder containing no volatile carriers. Thus, a curing process is not necessary to remove these volatile carrier materials. After the solder is disposed on the pins and electrical connector, either during the casting operation, or by means of positioning the arrays of plural solder preforms on carrier strips or connected by integral links or blocks, the solder can be heated so that the molten solder flows into the holes in the printed circuit board. A flux can be previously disposed on the exterior of the solder doughnuts or on the printed circuit board in and around the plated through holes. For example, the solder doughnuts can be dipped into a flux either before the array of solder doughnuts are positioned on pins in the connector, or after the preforms are disposed on the connector but before the connector is mounted on the printed circuit board.

We claim:

1. A method of soldering a plurality of through-hole electrical contact pins, positioned in a multipin electrical connector, in holes in a printed circuit board by reflowing the solder predisposed on the pins so that the predisposed solder flows into the holes, wherein a plurality of solder preforms, each of which has a pin-receiving hole extending therethrough, are cast onto a separate insulating carrier member in an array corresponding to the positions of the holes in the printed circuit board for predisposition on said pins, the solder preforms being cast by casting molten solder in a mold configured to form the array with the solder preforms positioned to correspond to the positions of the pins, wherein the array of solder preforms are held by said carrier member on the plurality of pins prior to positioning the connector on the printed circuit board, and reflowing said solder about said electrical contact pins.

2. The method of claim 1 wherein the separate carrier is positioned in a first position on pins in an electrical connector, the carrier and the preforms being shifted to a second position on the pins when the electrical connector is mounted on the printed circuit board, each preform in the second position being in contact with the printed circuit board.

3. The method of claim 4 wherein the plurality of solder preforms are cast in a continuous array.

4. The method of claim 3 wherein adjacent preforms are joined by a strip of solder, the strip of solder being thin enough so that each strip is severed during solder reflow so that individual solder preforms are separated during solder reflow.

5. The method of claim 3 wherein the individual solder preforms are each joined by thin segments to a solder web, the solder preforms extending below the solder web, the method including the further step of mechanically severing the thin segments when the solder preforms are positioned on the pins.

6. The method of claim 1 wherein the plurality of solder preforms are simultaneously cast in said array.

7. The method of claim 1 wherein said solder preforms consist of an alloy of tin and lead, the method comprising the further step of applying flux before reflowing the predisposed solder.

8. The method of claim 1 wherein the solder preforms are cast onto a separate carrier having holes therein which are arranged to correspond to the positions of the pins in the multipin electrical connector.

9. The method of claim 8 wherein the carrier is a film-like material.

* * * * *

UNITED STATES PATENT OFFICE
CERTIFICATE OF CORRECTION

Patent No. 5,029,748                    Dated  July 9, 1991

Inventor(s)  John H. Lauterbach and Leon T. Ritchie

It is certified that error appears in the above-identified patent and that said Letters Patent is hereby corrected as shown below:

In claim 3, column 8, line 6, "claim 4" should be --claim 2--.

In claim 5, column 2, line 15, before the second occurrence of "solder" insert --individual--.

Signed and Sealed this

Twenty-fourth Day of November, 1992

*Attest:*

DOUGLAS B. COMER

*Attesting Officer*            Acting Commissioner of Patents and Trademarks